(12) United States Patent
Curran et al.

(10) Patent No.: US 10,927,473 B2
(45) Date of Patent: Feb. 23, 2021

(54) OXIDE COATINGS FOR METAL SURFACES

(71) Applicant: Apple Inc., Cupertino, CA (US)

(72) Inventors: James A. Curran, Morgan Hill, CA (US); Zechariah D. Feinberg, San Francisco, CA (US); Christopher D. Prest, San Francisco, CA (US); Joseph C. Poole, Hayward, CA (US)

(73) Assignee: APPLE INC., Cupertino, CA (US)

( * ) Notice: Subject to any disclaimer, the term of this patent is extended or adjusted under 35 U.S.C. 154(b) by 284 days.

(21) Appl. No.: 15/487,300

(22) Filed: Apr. 13, 2017

(65) Prior Publication Data

US 2018/0084658 A1    Mar. 22, 2018

Related U.S. Application Data

(60) Provisional application No. 62/398,446, filed on Sep. 22, 2016.

(51) Int. Cl.
| | |
|---|---|
| *H05K 5/02* | (2006.01) |
| *H05K 5/04* | (2006.01) |
| *C25D 11/26* | (2006.01) |
| *C25D 11/18* | (2006.01) |
| *C23C 14/08* | (2006.01) |
| *C25D 11/16* | (2006.01) |
| *C23C 14/58* | (2006.01) |
| *C23C 16/40* | (2006.01) |
| *C23C 16/56* | (2006.01) |

(Continued)

(52) U.S. Cl.
CPC .............. *C25D 11/26* (2013.01); *C23C 14/08* (2013.01); *C23C 14/5886* (2013.01); *C23C 16/40* (2013.01); *C23C 16/56* (2013.01); *C25D 11/16* (2013.01); *C25D 11/18* (2013.01); *C25D 11/08* (2013.01); *C25D 11/243* (2013.01); *C25D 11/246* (2013.01)

(58) Field of Classification Search
CPC ............ C25D 11/04–246; C25D 11/26; H05K 5/04–069; H05K 5/06; C23C 16/40; C23C 16/403; C23C 14/081–083; C23C 14/10; C23C 16/56; C23C 16/401–405; B32B 3/263
See application file for complete search history.

(56) References Cited

U.S. PATENT DOCUMENTS

| | | | |
|---|---|---|---|
| 5,066,368 A | * | 11/1991 | Pasqualoni ............ C25D 11/14 205/112 |
| 6,087,018 A | | 7/2000 | Uchiyama |
| 2005/0269310 A1 | | 12/2005 | Buzzi et al. |

(Continued)

*Primary Examiner* — Lee E Sanderson
*Assistant Examiner* — Michael C Romanowski
(74) *Attorney, Agent, or Firm* — Dorsey & Whitney LLP

(57) ABSTRACT

Oxide coatings that reduce or eliminate the appearance of thin film interference coloring are described. In some embodiments, the oxide coatings are configured to reduce the appearance of fingerprints. In some cases, the oxide coatings are sufficiently thick to increase the optical path difference of incident light, thereby reducing any inference coloring by the fingerprint to a non-visible level. In some embodiments, the oxide coatings have a non-uniform thickness that changes the way light reflects off of interfaces of the oxide coating, thereby reducing or eliminating any thin film interference coloring caused by the oxide coatings themselves or by a fingerprint.

10 Claims, 12 Drawing Sheets

(51) Int. Cl.
*C25D 11/08* (2006.01)
*C25D 11/24* (2006.01)

(56) References Cited

U.S. PATENT DOCUMENTS

| | | | |
|---|---|---|---|
| 2008/0014420 A1 | 1/2008 | Chan | |
| 2008/0274375 A1* | 11/2008 | Ng | C25D 11/08 |
| | | | 428/687 |
| 2011/0056836 A1* | 3/2011 | Tatebe | C25D 11/16 |
| | | | 205/50 |
| 2013/0108813 A1* | 5/2013 | Zhu | H05K 5/0243 |
| | | | 428/34.6 |
| 2013/0153428 A1 | 6/2013 | Akana et al. | |
| 2014/0238867 A1* | 8/2014 | Ranganathan | C25D 7/0607 |
| | | | 205/250 |
| 2014/0363623 A1* | 12/2014 | Sun | H04M 1/0202 |
| | | | 428/119 |
| 2015/0368823 A1 | 12/2015 | Curran et al. | |
| 2016/0181688 A1* | 6/2016 | Gu | H01Q 1/242 |
| | | | 343/702 |

* cited by examiner

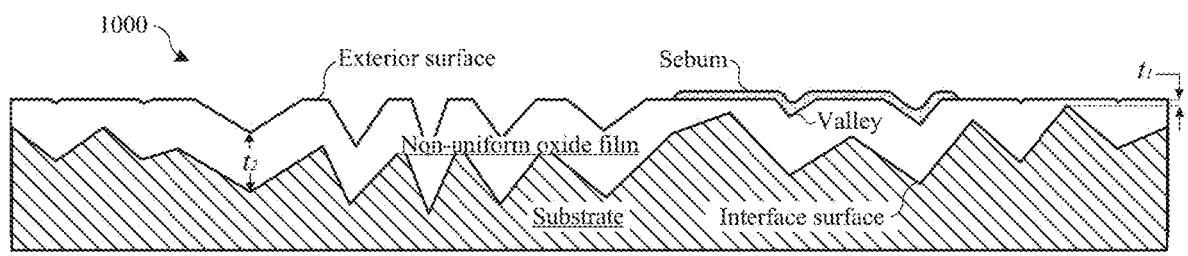
*FIG. 10C1*
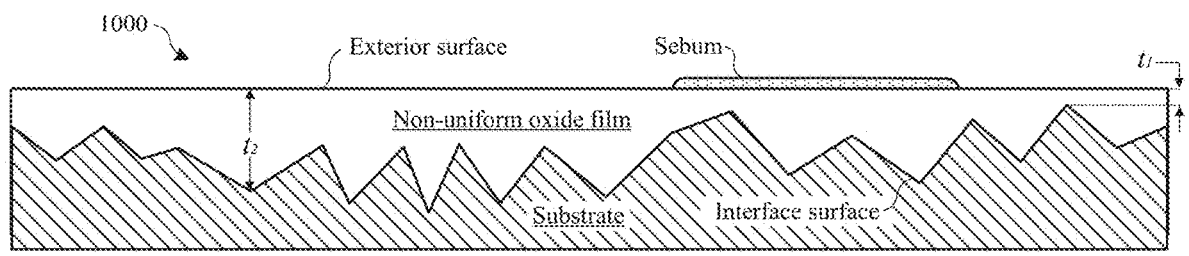
*FIG. 10C2*

OXIDE COATINGS FOR METAL SURFACES

CROSS-REFERENCE TO RELATED APPLICATION

This application claims the benefit of priority under 35 U.S.C. § 119(e) to U.S. Provisional Application No. 62/398,446, entitled "OXIDE COATINGS FOR METAL SURFACES," filed on Sep. 22, 2016, which is incorporated by reference herein in its entirety.

FIELD

The described embodiments relate to oxide coatings for metal surfaces, including surfaces of titanium and titanium alloys. The coatings can include an oxide film configured to reduce or eliminate interference-coloring effects brought upon by fingerprints or other thin films.

BACKGROUND

Titanium and its alloys are well suited to the manufacture of consumer electronics due their high strength, stiffness and hardness. For example, the relatively high hardness of titanium makes it resistant to scratches, and its stiffness makes it durable enough to withstand bending. In addition, titanium is inherently more corrosion-resistant than certain other alloys. One of the disadvantages of using titanium and its alloys, however, is that oil from fingerprints can be readily seen on bare titanium and titanium alloy surfaces, leaving unattractive marks on the consumer electronics. The nature and volume of the fingerprints can be factors, but even clean fingers can leave a relatively dramatic mark on titanium surfaces. Conventional oleophobic coatings used to reduce fingerprinting on glass are designed to repel fingerprint oil. However, these types of coatings can be of little benefit on titanium surfaces, and can even detract from the cosmetic look and feel of a product. What are needed therefore are improved cosmetic surface finishes for titanium and its alloys.

SUMMARY

This paper describes various embodiments that relate to coatings for metal surfaces, such as surfaces of titanium and titanium alloys. In particular embodiments, the coatings are oxide coatings that are configured to reduce or eliminate the appearance of fingerprint smudges or other surface artifacts.

According to one embodiment, a part is described. The part includes a substrate and an oxide film disposed on the substrate. A thickness of the oxide film is between about 1 micrometer and about 5 micrometers and varies across a length of the oxide film by at least 500 nanometers.

According to another embodiment, a method of forming an oxide film on a substrate of a part is described. The method includes performing a surface finishing operation on the substrate. The method also involves forming the oxide film on the substrate. The method further includes performing a surface finishing operation on the oxide film. A thickness of the oxide film is between about 1 micrometer and about 5 micrometers and varies across a length of the oxide film by at least 500 nanometers.

According to a further embodiment, an enclosure for an electronic device is described. The enclosure includes a metal substrate. The enclosure also includes an oxide film disposed on the metal substrate. The oxide film is defined by an exterior surface and an interface surface adjacent to the metal substrate. The exterior surface has a roughness (Ra) of 0.25 micrometer or less and the interface surface has a roughness (Ra) of 0.5 micrometer or greater.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements.

FIGS. 10A-10C2 show cross-section views of a part undergoing a process for forming a non-uniform oxide film, in accordance with some embodiments.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Described herein are oxide coatings that are configured to reduce or eliminate thin film interference coloring effects. In some embodiments, the oxide coatings are configured to reduce thin film interference coloring brought upon by fingerprints, which may be especially useful for titanium and titanium alloys substrate, since titanium and titanium alloys may be prone to developing visible fingerprints compared to other metals. This is partially due to the relatively low reflectivity of titanium and titanium alloy surfaces. In some embodiments, the oxide coatings are applied to substrates composed of metals other than titanium or titanium alloys, such aluminum, aluminum alloy, steel, magnesium, magnesium alloys, zirconium, or zirconium alloys.

In some embodiments, the oxide coatings are sufficiently thick to increase the optical path difference of incident light, thereby reducing any inference coloring by the fingerprint to a non-visible level. In some embodiments, the oxide coatings have a non-uniform thickness that changes the way light reflects off interfaces of the oxide coating, thereby reducing or eliminating any thin film interference coloring.

The coatings described herein are well suited for providing cosmetically appealing surface finishes to consumer products. For example, the coatings described herein can be used to form durable and cosmetically appealing finishes on enclosures of computers, portable electronic devices, wearable electronic devices, and electronic device accessories, such as those manufactured by Apple Inc., based in Cupertino, Calif. As used herein, the terms oxide, oxide coating, oxide film, oxide layer, metal oxide, metal oxide coating, metal oxide film, metal oxide layer, etc. can be used interchangeably and can refer to suitable oxide material, unless otherwise specified.

These and other embodiments are discussed below with reference to FIGS. 1-13. However, those skilled in the art will readily appreciate that the detailed description given herein with respect to these Figures is for explanatory purposes only and should not be construed as limiting.

Figure 1:
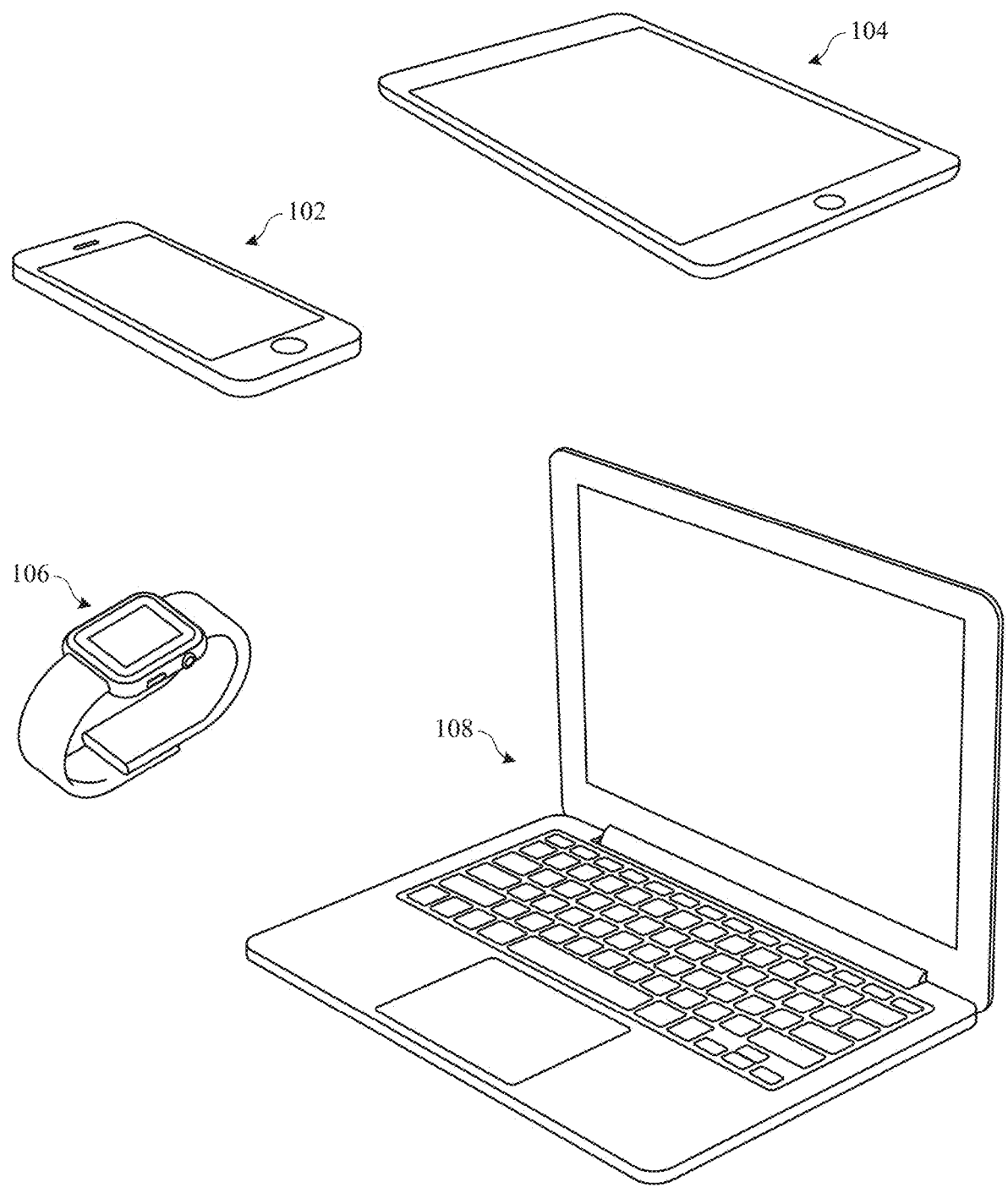
FIG. 1 shows perspective views of devices having metal surfaces that can be treated with the coatings described herein.

FIG. 1 shows consumer products than can include titanium or titanium alloy substrates described herein. FIG. 1 includes portable phone 102, tablet computer 104, smart watch 106 and portable computer 108, each of which can include enclosures that are made of metal or have metal sections. In some cases, the metal or metal sections are composed of aluminum and/or aluminum alloy. In some cases, the metal or metal sections can be composed of titanium or titanium alloys, such as Ti6Al4V alloys.

Aluminum and aluminum alloys are light-weight and generally have a bright cosmetic appearance. Furthermore, aluminum and aluminum alloys can be anodized to form a protective anodic oxide film that can be harder than the underlying aluminum or aluminum alloy substrate, thereby providing a protective and scratch resistant coating. However, if the anodic film is below a certain thickness, the anodic oxide film can produce thin film interference coloring. In some applications, this thin film interference coloring can detract from the cosmetic appeal of the enclosures of devices 102, 104, 106 and 108.

Titanium and titanium alloys can be of greater stiffness than aluminum, and lighter weight than stainless steel. The relatively high hardness of titanium makes it more resistant to scratches than some metals—especially when it is additionally case-hardened by processes such as solution nitriding, or carburizing. Titanium is also inherently corrosion-resistant. However, surfaces of titanium can be prone to developing visibly apparent and unsightly smudges, such as from fingerprint oils. Such smudges are visible due to optical properties of reflected light and thin film interference coloring effects. This can make titanium enclosures of devices 102, 104, 106 and 108 develop visible cosmetic defects after normal use.

Figure 2:
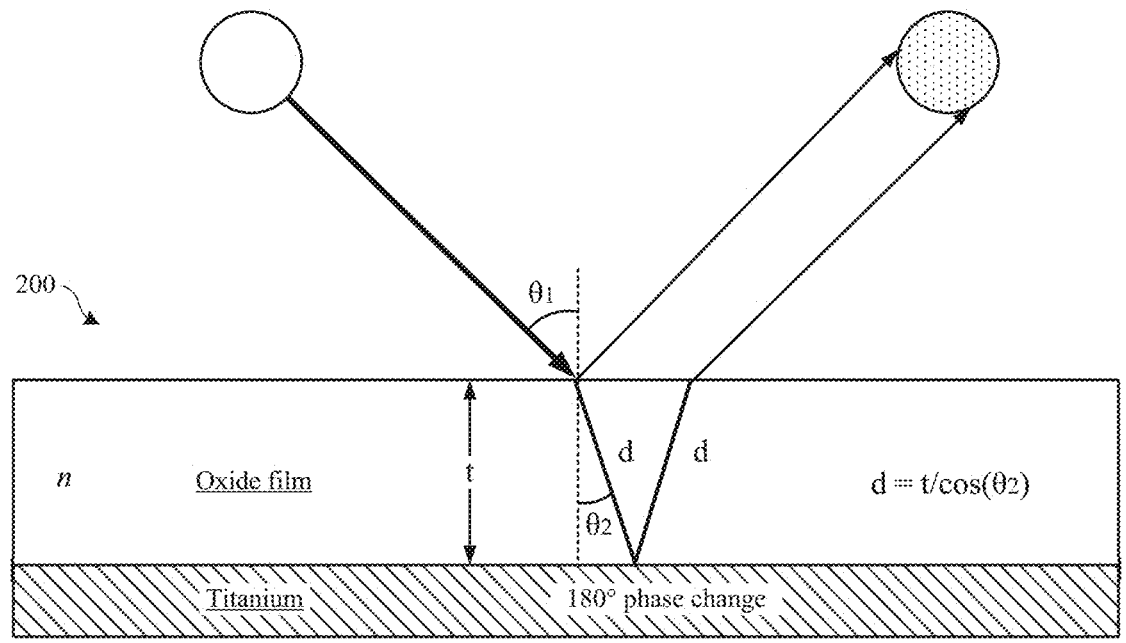
FIG. 2 shows a cross-section view of a part, illustrating how a thin oxide film can result in interference coloring.

In general, interference coloring relies on a translucent film creating two approximately parallel and closely spaced reflective planes. FIG. 2 shows a cross-section view of part 100, illustrating the how a thin oxide film can result in interference coloring. Part 100 includes a titanium substrate and an oxide film (e.g., a titanium oxide). The oxide film is at least partially transparent to visible light and has a refractive index n. Light incident on part 200 is reflected by two planes. In particular, a first portion of light reflects off the top surface of the oxide film. A second portion of light reflects off the underlying surface of the titanium substrate, which can be referred to as an interface between the oxide film and the titanium substrate. The optical path difference between the two distinct paths taken by the two portions of light from the same origin are such that coherent (or semi-coherent) light of certain wavelengths (or colors) is exactly out of phase with light reflected from the other plane and those reflections thus interact destructively when they recombine—"cancelling out" that component of the otherwise white color of the reflected light. The optical path difference between two paths taken by light depends on the distance d between the two reflective planes (i.e., the thickness of the oxide film) and the index of refraction n of the oxide film. In some embodiments, an oxide film thickness of about 10 micrometers or less can result in visible interference coloring. In some embodiments, an oxide film thickness of about 3 micrometers or less can result in visible interference coloring.

Figure 3:
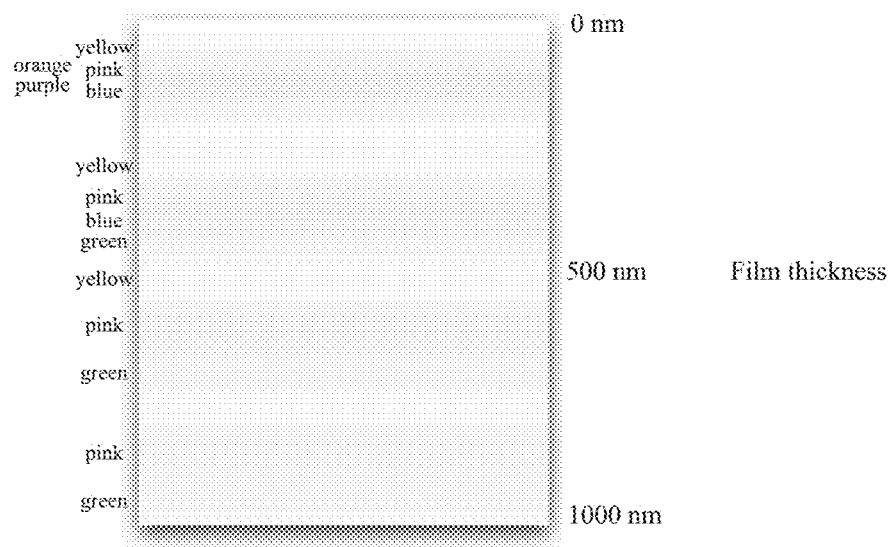
FIG. 3 shows a calculated spectrum of interference colors for anodized aluminum indicating a relationship between film thickness and a resulting interference color.

FIG. 3 shows a calculated interference color spectrum for anodized aluminum indicating a relationship between film thickness and a resulting interference color. The first color observed as an interference film's thickness is increased from zero is yellow (corresponding to an optical path difference of about 450 nm and the removal of the shortest wavelength "blue" end of the white light spectrum). As the optical path difference is increased further, the wavelength cycles through the subtractive color spectrum yielding orange, pink, purple, and finally blue when the red end of the white light spectrum is removed). However, this sequence does not repeat, because for example, by the time path difference corresponds to two red wavelengths (i.e., about 1300 nm), it in also corresponds to nearly three blue wavelengths. So, in the second order interference colors, both red and blue are removed, yielding a green color instead of purple. For the same reason, the colors become less intense for higher order interference, becoming ever fainter alternations of green and pink. The most intense colors are observed in thin film thicknesses, i.e., in the tens to hundreds of micrometers. As the film thickness reaches the micrometer range, colors are already more muted and are limited to hues of pink and green—as predicted by the behavior of higher order interference of white light. This dilution of the interference effect may also be helped by the greater opportunities for optical path diversions in a thicker film—for example, due to imperfections in the oxide film that causes internal reflection or refraction, but also, and especially where the texture of the metal surfaces (e.g., titanium surface) is rough and reflections are less specular.

Figure 4:
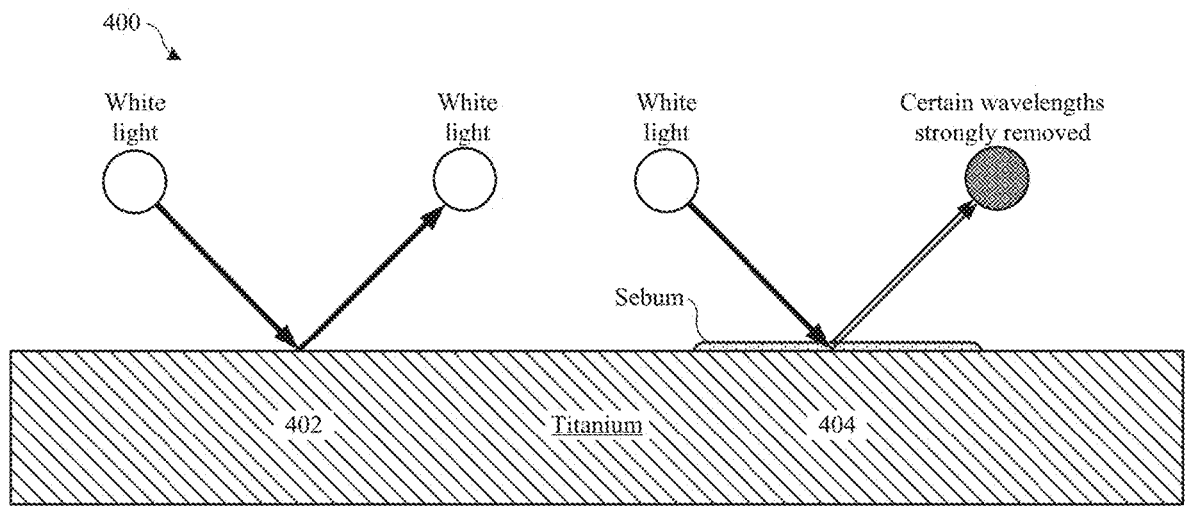
FIG. 4 shows a cross-section view of a part composed of a titanium substrate, indicating how light is reflected off a surface of the titanium substrate.

Thin film interference coloring is the reason why fingerprints are so visible on bare titanium surfaces. To illustrate, FIG. 4 shows a cross-section view of part 400 composed of a titanium substrate, indicating how light is reflected off a surface of the titanium substrate. The titanium substrate can be composed of pure titanium or a titanium alloy, such as a Ti6Al4V alloy. On a first portion 402 of part 400, white light (which contains a mixture of wavelengths of the visible spectrum) impinges directly upon a bare surface of the titanium substrate and reflects off as white light. Thus, the bare titanium substrate surface will appear shiny.

In contrast, on a second portion 404 of part 400 is a layer of sebum, corresponding to a thin film of oil from a user's finger. In this case, the incident light reflects off the layer of sebum and off the underlying titanium substrate. For example, a first portion of light reflects off the top surface of the sebum and a second portion of the light reflects off the surface of the titanium. Since the layer of sebum is very thin and the top surface of sebum is substantially parallel to the top surface of the titanium, the difference in optical paths (distance the light travels through the sebum) between the two portions of light reflected interfere with one another, causing certain wavelengths to be removed and others intensified. This causes the titanium substrate to appear a certain color, also referred to as interference coloring.

Figure 5:
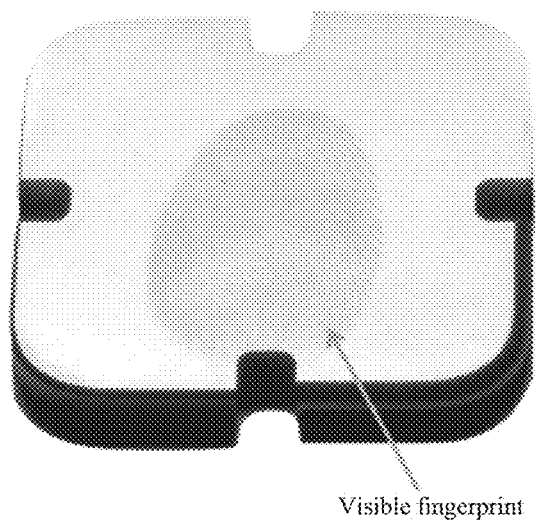
FIG. 5 shows a perspective view of a part composed of a titanium substrate without a coating, showing a visible fingerprint.

FIG. 5 shows a perspective view of a part made of bare Ti6Al4V alloy substrate (i.e., with no coating), which shows a very visible fingerprint. In general, fingerprints may be more visible under certain illumination and observation conditions. For example, fingerprints are typically most apparent when illuminated with diffuse, white light—especially when this light is polarized or semi-coherent, and when observed at an oblique angle. However, users of consumer products, such as the enclosures of electronic devices, will be expected to use their products under many different types of light sources and view their products at any angle. Thus, this propensity of titanium to show fingerprints can be unacceptable for manufactures of such consumer products.

One of the reasons why titanium is prone to developing visible smudges compared to aluminum relates to the reflectivities of the two types of metals. To illustrate, FIG. 6A shows a cross-section view of part 600 composed of an aluminum substrate (i.e., composed of pure aluminum or an aluminum alloy), and FIG. 6B shows a cross-section view of part 606 composed of a titanium substrate (i.e., composed of titanium or titanium alloy), respectively.

Figure 6A:
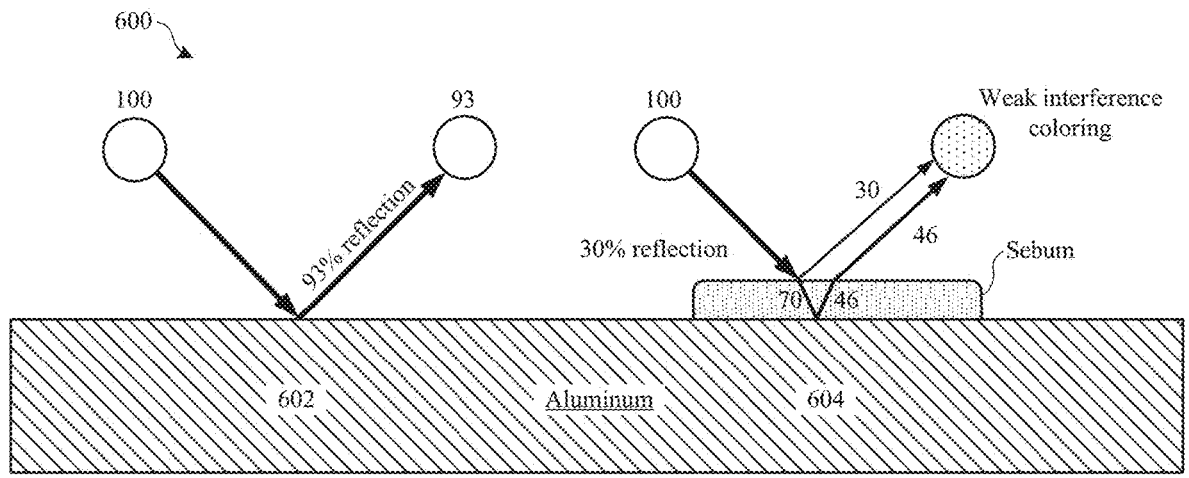
FIG. 6A shows a cross-section view of a part showing how light reflects off of an aluminum substrate.

FIG. 6A shows that around 93% of visible light gets reflected off of a portion 602 of the bare aluminum substrate. Thus, the intensity of the light is reduced from 100% to 93%. When a layer of sebum is deposited on portion 604 of part 400, about 30% of the light is reflected off the top surface of the sebum layer and about 70% of the light reaches the aluminum substrate. Of the 70% of light that reaches the aluminum substrate, about 46% of the light gets reflected. Thus, a first portion of reflected light will have an intensity of about 30%, and a second portion of reflected light will have an intensity of about 46%. This dis-similarity of light intensities results in weak interference between the two portions of light such that any coloration by thin film interference of by the sebum layer will be unnoticeable.

Figure 6B:
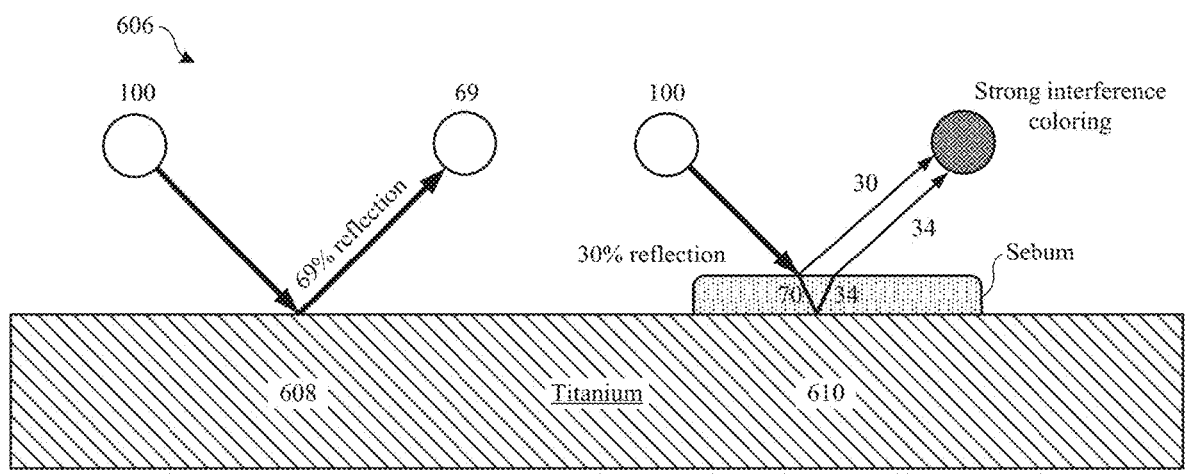
FIG. 6B shows a cross-section view of a part showing how light reflects off of a titanium substrate.

FIG. 6B shows that titanium has a lower reflectivity than aluminum. In particular, only about 69% of visible light gets reflected off portion 608 of bare titanium substrate compared to 93% reflected by the aluminum substrate. When a layer of sebum is deposited on portion 610 of part 406, 30% of the light is reflected off the top surface of the layer of sebum. However, only about 34% of the light gets reflected off the surface of the titanium compared to 46% reflected off aluminum since titanium is less reflective than aluminum. For example, a first portion of reflected light will have an intensity of about 30%, and a second portion of reflected light will have an intensity of about 34%. This similarity of light intensities results in strong interference between the two portions of light such that visible thin film interference coloring occurs.

Oleophobic coatings, such as those designed to repel fingerprint oil, have not been found to sufficiently reduce the interference coloring effects of fingerprints when applied on titanium surfaces. The optical properties of the surface itself (e.g., color and surface roughness or specularity of reflection) contribute somewhat to the apparent visibility of fingerprints, and could be adjusted (e.g., made darker, or given a coarser and less uniform texture) to hide fingerprints somewhat. But these methods may have only limited success if the intent is to achieve a bright, highly reflective and lustrous finish, characteristic of metal surfaces (e.g., either in a polished mirror-like surface texture or with a fine, sparkly satin-like blasted texture).

The surface treatments described herein are shown to be effective in minimizing the appearance of fingerprints on titanium and other metal surfaces. The treatments involve depositing one or more oxide films having physical features that influence the way light reflects off of the oxide film, thereby directly addressing the interference coloring mechanism. According to some embodiments, the oxide films are sufficiently thick so as to increase the interference path length of incident light, thereby mitigating the interference coloring effects. According to other embodiments, surfaces of the oxide films have non-parallel interfaces that prevent interference coloring from occurring at visible levels.

Figure 7:
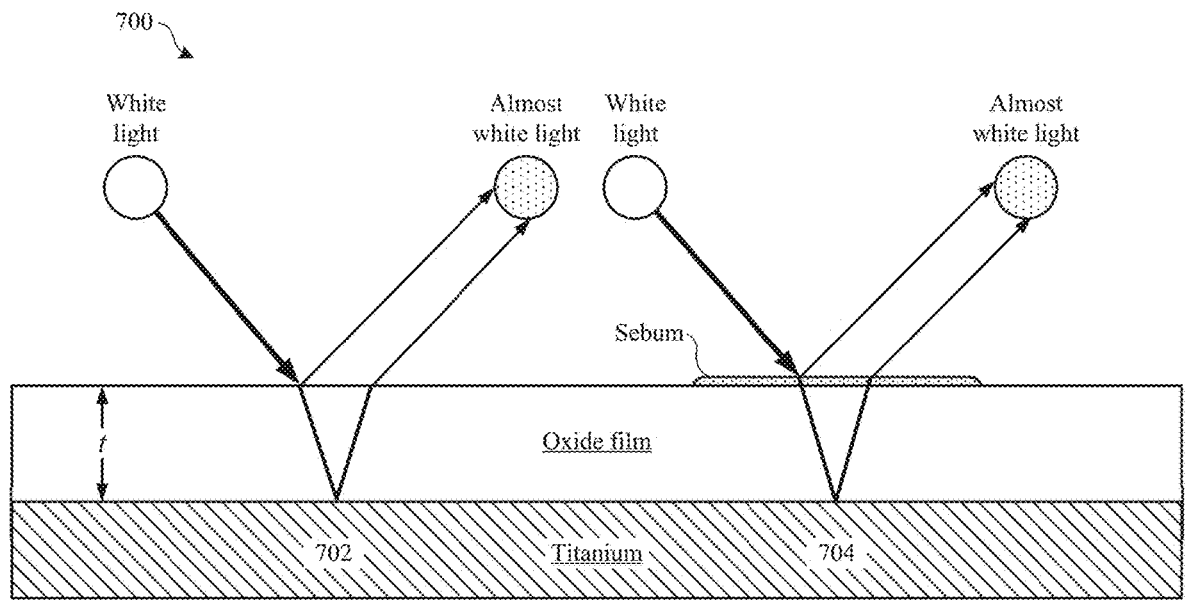
FIG. 7 shows a cross-section view of a part composed of a titanium substrate having a fingerprint-hiding oxide coating.

FIG. 7 shows a cross-section view of part 700 composed of a titanium substrate having an oxide film, in accordance with some embodiments. The titanium substrate can be composed of pure titanium or a titanium alloy, such as a Ti6Al4V alloy. The oxide film can be composed of any suitable oxide material, such as an aluminum oxide (e.g., alumina), a titanium oxide (e.g., titania), a silicon oxide (e.g., silica), a zirconium oxide (e.g., zirconia), or suitable transparent, hard, ceramic phases. The oxide film can be applied using any suitable technique, which may include physical vapor deposition (PVD), sputtering, chemical vapor deposition (CVD), dip coating, or other suitable deposition techniques. In some cases, it is preferable that the oxide coating be deposited conformally to the titanium substrate. The oxide film can be referred to as an oxide layer, metal oxide layer, metal oxide film, oxide coating, metal oxide coating, or any suitable term.

At portion 702 of part 700, white light impinges on the oxide film and on the underlying surface of the titanium substrate. For example, a first portion of light reflects off the top surface of the oxide film, and a second portion of light reflects passes through the oxide film and reflects off the titanium substrate, thereby causing the two portions of light to constructive and destructively interfere with one another. However, the oxide film has a thickness t sufficiently large that the interference is very weak. That is, the relatively large thickness t creates a high-order optical path difference between the reflected portions of light, resulting in only minimal interference and almost white light being reflected. Thus, the oxide film is too thick to cause noticeable thin film interference coloring.

At portion 704 of part 700, white light impinges on a portion of the titanium substrate having a layer of sebum. The high-order optical path provided by the relatively thick oxide film mitigates any interference coloring from the layer of sebum. That is, any interference coloring from the layer of sebum will be mitigated and substantially canceled out by the high-order optical path difference, resulting in an almost white light reflection. Thickness t can vary depending on the material properties of oxide film (e.g., refractive index and transparency) and on application requirements such as a required minimum or maximum thickness for aesthetic purposes. In some embodiments, thickness t is at least about 5 micrometers, which corresponds to an increase in optical path of roughly 20 micrometers. In some embodiments, thickness t ranges from about 5 micrometers to about 50 micrometers.

Figure 8:
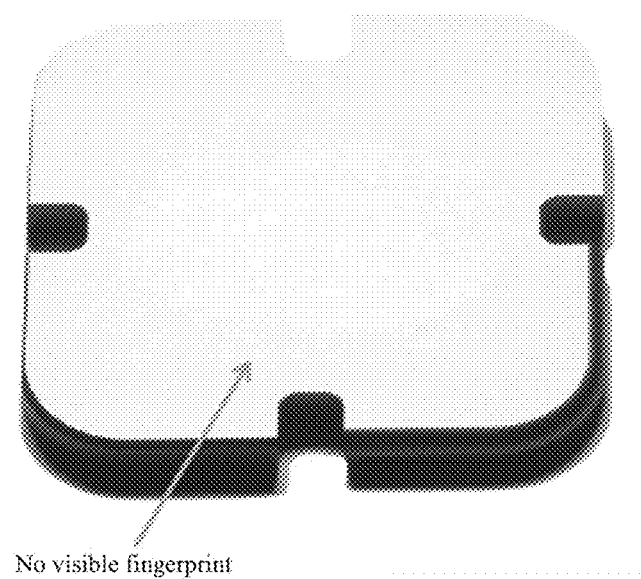
FIG. 8 shows a perspective view of a part composed of a titanium substrate with fingerprint-hiding oxide coating.

FIG. 8 shows a perspective view of a Ti6Al4V alloy substrate, which has an aluminum oxide ($Al_2O_3$) film having a thickness of about 10 micrometers. The same type of fingerprint is applied to the substrate shown in FIG. 8 as the uncoated substrate shown in FIG. 5. The fingerprint is not visible, even when illuminated with diffuse, white light, polarized or semi-coherent light, or when observed at an oblique angle.

It should be noted that titanium or titanium alloy surfaces do not conventionally require a protective coating since titanium and titanium alloys themselves are generally hard and relatively corrosion resistant. Thus, the methods described herein where an oxide film is deposited on a titanium or titanium alloy substrate would not conventionally be performed.

Another method of reducing or eliminating thin film interference effects involves forming an oxide film having a non-uniform thickness. This solution may be applicable to titanium substrates as well as substrates composed of other metals.

Figure 9A:
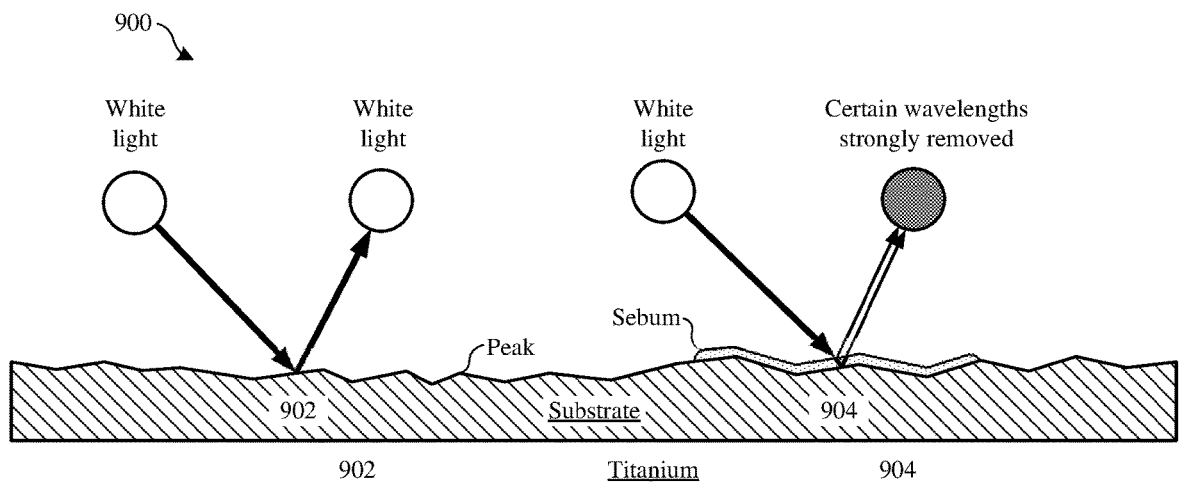
FIG. 9A shows a cross-section view of a part with a bare substrate.
Figure 9B:
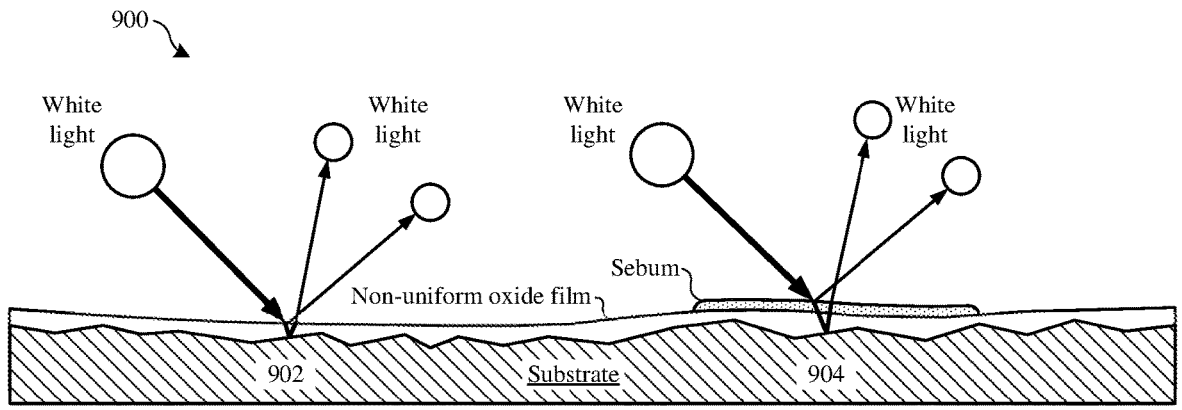
FIG. 9B shows a cross-section view of the part of FIG. 9A after a non-uniform oxide film is deposited on the substrate.

FIG. 9A shows a cross-section view of part 900 with a bare substrate, and FIG. 9B shows a cross-section view of part 900 after a non-uniform oxide film is deposited on the substrate. The substrate can be composed of any suitable metal. In some embodiments, the substrate is composed of titanium, a titanium alloy (e.g., a Ti6Al4V alloy), aluminum, or an aluminum alloy (e.g., a 6000 series or 7000 series aluminum alloy).

FIG. 9A shows that the substrate has surface variations characterized by surface features (e.g., peaks). In some embodiments, heights of these surface features vary on order of about 1 micrometer over a surface length of about 50 to about 500 micrometers. At portion 902 of part 900, white light reflects off the bare surface as colorless white light. A layer of sebum, which is generally in liquid or semiliquid form, is conformally deposited at portion 904 of part 900. Since the layer of sebum is conformal, a top surface of the sebum layer is substantially parallel with the top surface of the substrate. Furthermore, since the sebum layer is generally very thin, there is a low-order optical path difference between wavelengths of light reflecting off the substrate and wavelengths of light reflecting off the top surface of the layer of sebum. Thus, the sebum layer causing thin-film interference coloration on part 900.

FIG. 9B shows part 900 after a non-uniform oxide film has been formed on the substrate. The non-uniform oxide film can be composed on any suitable oxide material, such as an aluminum oxide (e.g., alumina), a titanium oxide (e.g., titania), a silicon oxide (e.g., silica), a zirconium oxide (e.g., zirconia), or suitable transparent, hard, ceramic phases. Non-uniform deposition of the oxide film can be accomplished using any suitable technique, including immersion or spraying of sol-gels or other liquid form of oxide material onto the surface of the substrate. The viscosity of the oxide material in liquid form can be chosen such that surface tension causes the liquid to spreads laterally across the surface of the substrate, thereby resulting in the non-uniform shape. In some applications, a subsequent curing process is required. The resulting oxide film can be a hard, transparent, glass-like coating.

The oxide film is non-uniform in that a top surface of the oxide film is non-parallel with a surface of the underlying substrate. That is, the profile of the top surface of the oxide film does not match the profile of the top surface of the substrate. In other words, the thickness of the oxide film varies, in some embodiments, by 1 micrometer or more. The non-uniform oxide film changes the manner in which incident light reflects off part 900. For example, at portion 902 of part 900, a first portion of light reflects off the top surface of the oxide film in a first direction, and a second portion of the light reflects off the surface of the substrate in a second direction that is non-parallel to the first direction. In this way, the two portions of light do not interfere with each other, and therefore do not produce interference coloring. Put another way, optical interference varies by many orders over a much shorter spatial region of the surface than can be perceived by an observer as being of any given color (e.g., about tens to hundreds of micrometers lateral scale of the surface features of part 900). Thus, part 900 can have a bright, sparkly finish, with hue variations on a scale smaller than can be perceived by the observer. This is irrespective of whether part 900 has a conformal layer of sebum (e.g., at portion 904).

Figure 10A:
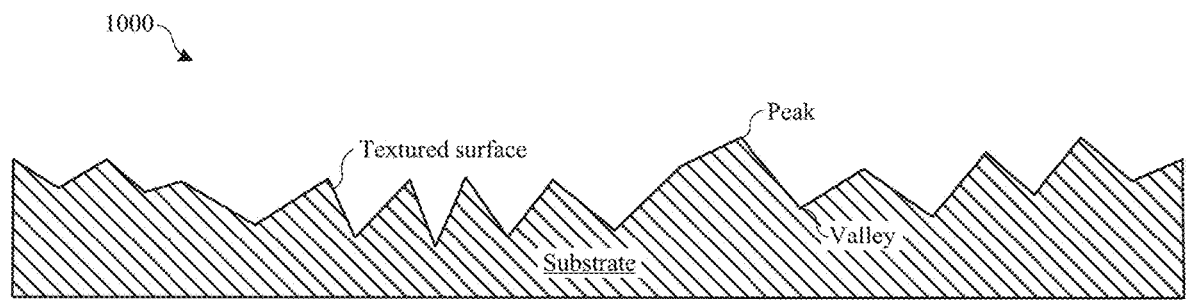

In some embodiment, a non-uniform oxide film is formed by creating a conformal oxide film, then modifying the oxide film. To illustrate, FIGS. 10A-10C2 show cross-section views of part 1000 undergoing a process for forming a non-uniform oxide film, in accordance with some embodiments. At FIG. 10A, a textured surface is formed on a substrate of part 1000. Substrate 1000 can be composed of any suitable metal, including aluminum, an aluminum alloy, titanium, or a titanium alloy. The textured surface can be formed using any suitable process. In some embodiments, the surface is blasted, which involves propelling a stream of hard particles (e.g., zirconia or silica particles) at the surface. In some embodiments, a chemically etching process is used, which generally involves exposing the surface to an acidic solution. In some embodiments, a combination of blasting and etching processes are used. The resulting textured surface has peaks and valleys, as shown. In some embodiments, the textured surface has a roughness value (Ra) of about 0.5 micrometers or greater.

Figure 10B:
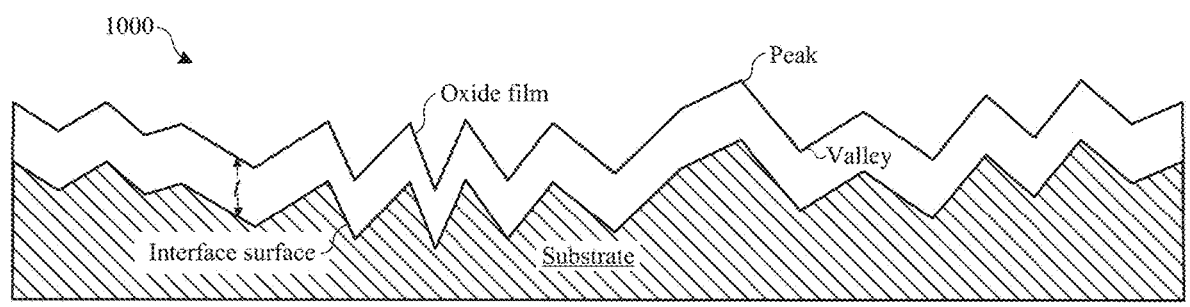

At FIG. 10B, an oxide film is formed on the substrate using any suitable technique. In some embodiments, the oxide film is formed using an anodizing process, whereby a portion of the substrate is converted to a corresponding metal oxide. For example, an aluminum or aluminum alloy substrate can form an aluminum oxide film. In particular embodiments, a Type II anodizing process is used, whereby the substrate is anodizing in a sulfuric acid-based electrolyte and the resulting oxide film is relatively transparent. In some embodiments, the anodizing process parameters are chosen so as to form an oxide film having a hardness value of at least about 300 HV, per Vickers hardness test.

In other embodiments, the oxide film is deposited on the substrate using, for example, PVD, sputtering, CVD, dip coating, or suitable combinations thereof. If a deposition technique is used, the oxide film can be composed of any suitable metal oxide material. In some cases, the oxide film is composed of an oxide of a metal different than the bulk metal of the substrate. For example, an aluminum oxide film can be deposited on a titanium or titanium alloy substrate. In other embodiments, the oxide film is composed of an oxide of a metal that is the same as the bulk metal of the substrate. For example, an aluminum oxide film can be deposited on an aluminum or aluminum alloy substrate.

In general, the structure of an oxide film formed by an anodizing process is different than the structure of an oxide film formed by deposition techniques. For example, many anodizing processes result in an oxide film having a porous structure, with a number very small elongated pores that extend from the top surface of the oxide film toward the interface between the oxide film and the substrate. The size of the pores can vary depending on the anodizing process, but generally have diameters on the scale of about 10 nm to about 150 nm. In contrast, oxide films formed using a deposition processes does not have such anodic film pore structure. Thus, given a particular thickness and type of metal oxide, the deposited oxide films generally have a greater hardness compared to anodic films.

The oxide film should be at least partially transparent to visible light such that underlying interface surface (also referred to as a surface of the substrate) is visible through the oxide film. The interface surface takes on the topology in accordance with the textured surface of the substrate prior to anodizing. In some embodiments, the interface surface has a roughness (Ra) of about 0.5 micrometers or greater. In addition, the oxide film is conformal to the interface surface such that the oxide film has corresponding peaks and valleys. That is, a top surface of the oxide film will generally have shape that matches the surface of the underlying substrate.

The amount of conformity of the oxide film can vary depending on the thickness of the oxide film and the type of method used to form the oxide film. For example, an anodizing process creates an oxide film that has a highly conformal profile. Oxide films deposited using some CVD and PVD processes can also result in a conformal oxide film. Oxide films deposited using dip coating techniques are generally less conformal than those deposited using CVD and PVD processes. The thickness t of the oxide film can vary depending on a desired final thickness and limitations of the techniques used to form the oxide film. Some of the oxide film will be removed during a subsequent removal process, which should be considered when forming the oxide film. In some embodiments, the oxide film prior to an oxide film removal process has a thickness t ranges from about 2 micrometers to about 10 micrometers.

FIGS. 10C1 and 10C2 each show part 1000 after an exterior surface (outer surface) of the oxide film is removed to form a non-uniform oxide film—i.e., an oxide film of varied thickness. In the embodiment of FIG. 10C1, the oxide removal process is chosen so as to remove the most prominent features (peaks) of the oxide film while leaving indented (valleys) substantially intact. In the embodiment of FIG. 10C2, the oxide removal process is chosen such that the exterior surface of the oxide film is smooth and substantially planar. In some cases, the exterior surface of the oxide film is smoothed to a roughness value (Ra) of about 0.25 micrometer or less. Thus, the roughness of the interface surface (e.g., Ra of 0.5 micrometer or greater) is greater than the roughness of the outer surface (e.g., Ra of 0.25 micrometer or less). This roughness comparison can be measured over at least a predetermined area or length of part 1000. For example, the roughness measurements can be taken over at least a 50 micrometer length across part 1000. Any suitable oxide removal process can be used. In some cases, one or more lapping, polishing, buffing and chemical etching processes are used.

The final thickness of the oxide film varies from a minimum thickness $t_1$ to maximum thickness $t_2$. In some applications, the maximum $t_2$ is preferably thin since thinner oxide films are generally more transparent, thereby providing better viewing of the interface surface, which mostly determines the surface appearance of part 1000. In some applications, however, the minimum thickness $t_1$ should be large enough to provide adequate protection to the substrate, especially if the substrate is relatively soft. The minimum thickness $t_1$ and maximum thickness $t_2$ can vary depending on the type of substrate, the hardness of the oxide film, and the type of part 1000. In some embodiments, the minimum thickness $t_1$ and maximum thickness $t_2$ each range from about 1 micrometer to about 5 micrometers. In some embodiments, the thickness variation (i.e., $t_2-t_1$) of the oxide film varies by 500 nanometers or more across a length of part 1000. This thickness variation can be measured over at least a predetermined area or length of part 1000. For example, the oxide film can have a thickness variation of at least 500 nanometers over at least a 50 micrometer length across part 1000, but not over such a large length (e.g., 500 micrometers or more) so as to give easily apparent thickness and hence interference color variation to an observer's eye.

Although the oxide film can be thin enough to cause interference coloring, the non-uniform nature of the oxide film prevents such interference coloring from occurring. In particular, the interface surface (corresponding to the underlying substrate surface) is non-parallel with the exterior surface (outer surface) of the oxide film. As described above with reference to FIGS. 9A and 9b, optical interference varies by many orders over a much shorter spatial region of the surface of part 1000 than can be perceived by an observer as being of any given color. This diminishes any interference effects due to the thinness of the oxide film, irrespective of whether part 1000 has a sebum layer.

Figure 11:
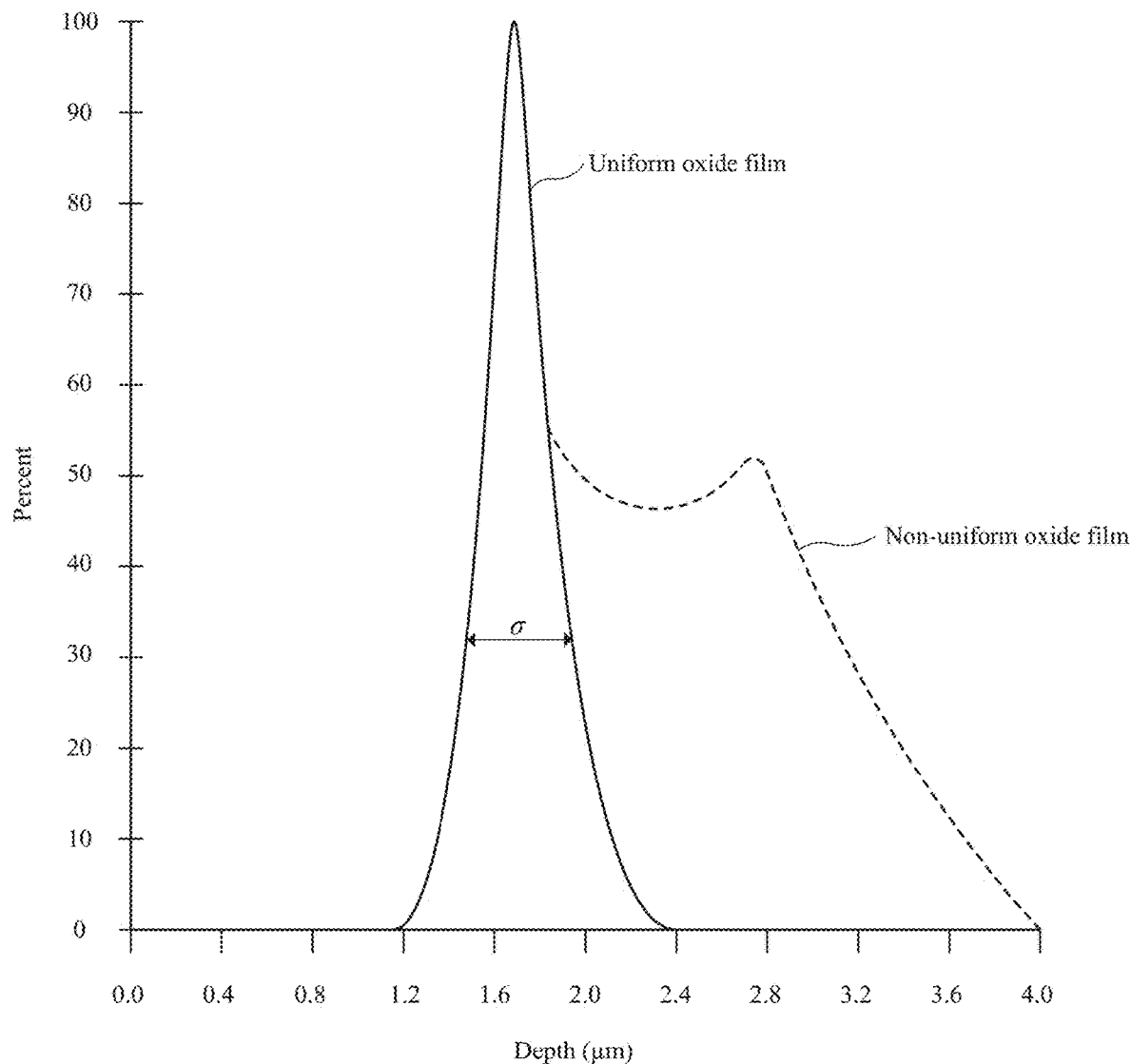
FIG. 11 shows a histogram illustrating thickness distributions of a uniform oxide film and a non-uniform oxide film.

FIG. 11 shows a histogram (i.e., Abbott-Firestone curve) comparing depth distributions of a uniform thickness oxide film and a non-uniform thickness oxide film, which correspond to the thickness variations of the oxide films. Each of the substrates is an aluminum substrate with a textured surface by blasting and was anodized. The depth measurements were performed over a two square millimeter area of each of the anodized substrates. The substrate with the non-uniform thickness oxide film was lapped after anodizing while the substrate with the uniform thickness oxide film was not lapped. Each of the uniform oxide thickness film and the non-uniform oxide film has a thickness of about 2 micrometers.

The histogram of FIG. 11 indicates that the uniform oxide thickness film has standard Gaussian thickness with a standard deviation (a) ranging from about 100 nm and about 200 nm. In contrast, the non-uniform oxide thickness film deviates from the standard Gaussian thickness distribution, and has a thickness distribution range of about 1.2 micrometers or more. The substrate with the uniform oxide thickness film has visible pink and green hues by interference coloring, while the substrate with the non-uniform oxide thickness film has no such visible interference coloring. In some embodiments, an oxide thickness variation of at least about 500 nanometers results in sufficient reduction of interference effects such that any interference coloring is not visible.

Figure 12A:
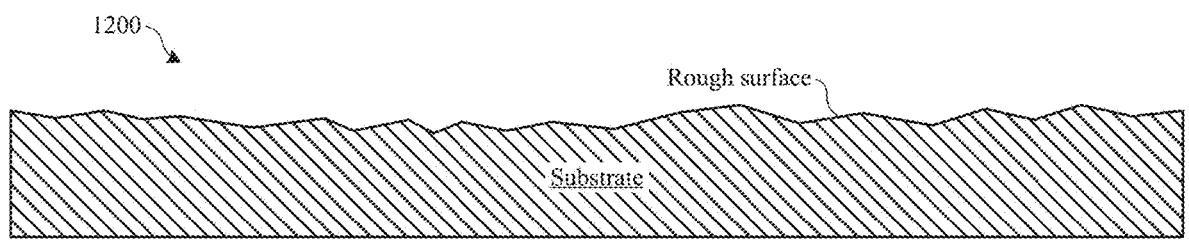
FIGS. 12A-12D show cross-section views of a part undergoing a process for forming a non-uniform oxide film, in accordance with some embodiments.
Figure 12B:
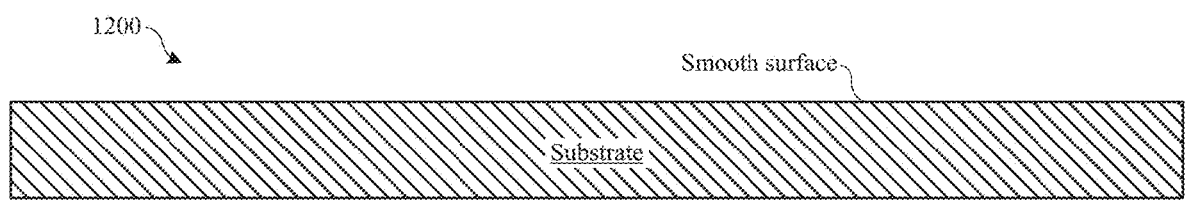
Figure 12C:
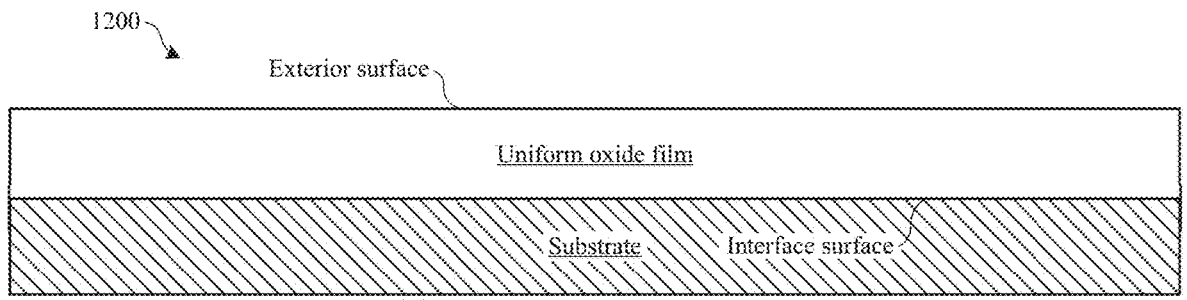

Indeed, changing the texture of either reflective plane with respect to the other (the exterior surface of the oxide film or the interface surface) can help diminish interference effects. FIGS. 12A-12C show cross-section views of part 1200 undergoing an alternative process for forming a non-uniform oxide film, in accordance with some embodiments. FIG. 12A shows a substrate having a rough surface. The substrate can be composed of any suitable metal, including aluminum, an aluminum alloy, titanium, or a titanium alloy. At FIG. 12B, the rough surface is smoothed using, for example, one or more lapping, mechanical polishing, buffing and chemical polishing processes. In some embodiments, the substrate surface is smoothed to a roughness value of (Ra) of 0.25 micrometer or less.

FIG. 12C shows part 1200 after formation of a substantially uniform oxide film. In some embodiments, the oxide film is formed using an anodizing process, whereby a portion of the substrate is converted to a corresponding metal oxide. For example, an aluminum or aluminum alloy substrate can form an aluminum oxide film. In other embodiments, the oxide film is deposited on the substrate using, for example, PVD, sputtering, CVD, dip coating, or suitable combinations thereof. If a deposition technique is used, the oxide film can be composed of any suitable metal oxide material. For example, an aluminum oxide film can be deposited on a titanium or titanium alloy substrate. In embodiments where a conformal process is used (e.g., anodizing, CVD, etc.), an exterior surface of the oxide film will have surface profile that matches the surface profile of the interface between the substrate and the oxide film (also referred to as a surface of the substrate, or an interface surface adjacent to the substrate). The thickness of the oxide film can vary depending on a desired final thickness and limitations of the techniques used to form the oxide film. In some embodiments, the interface surface has a roughness (Ra) of about 0.01 micrometers or less.

Figure 12D:
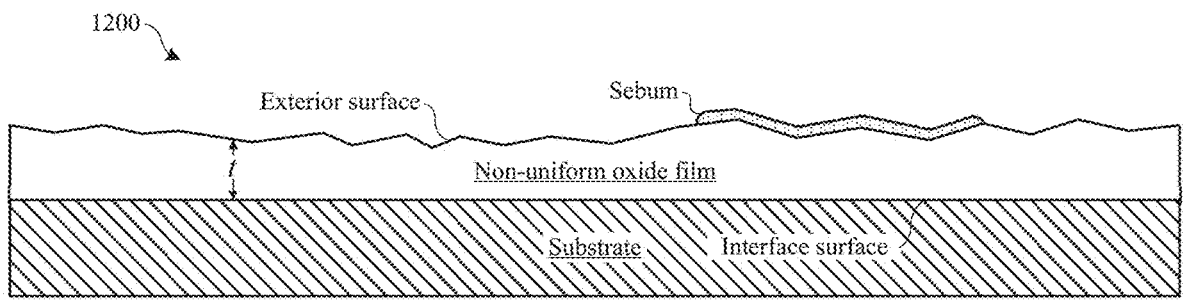

FIG. 12D shows part 1200 after an oxide texturing process, whereby the exterior surface (outer surface) of the oxide film has a rough topology, i.e., rough surface. In some embodiments, the exterior surface is treated to a roughness (Ra) of about 0.5 micrometers or greater. The roughening process can involve, for example, exposing the exterior surface of the oxide film to a blasting process (propelling a blasting media to the exterior surface), a chemical etching process configured to etch oxide material, or a combination of both. Note, however, such roughening processes may damage the oxide film if applied too aggressively. For example, if the oxide film is an anodic film having a porous structure from the anodizing process (e.g., having pores with diameters on the scale of about 10 nm to about 150 nm), a blasting process or chemical etching process may alter this porous structure. In some cases, a blasting or chemical etching process may make the oxide film less transparent. Thus, it may be beneficial to adjust the blasting or chemical etching process accordingly. For example, a blasting media can be composed of softer particles or propelled a lower speeds than would be used for blasting a metal surface.

The thickness t of the oxide film can vary depending on application requirements. In some embodiments, the oxide film has a thickness t ranging from about 2 micrometers to about 10 micrometers. This is thinner than oxide film coating for many applications since transparent films at this thickness conventionally result in unwanted interference coloring. Thus, conventional applications may require an oxide film of greater than about 10 micrometers. However, since the present oxide film has a non-uniform thickness, no visible interference coloring is observed. Furthermore, a sebum layer is deposited on the non-uniform oxide film will not cause visible interference coloring. In some embodiment, the oxide film has a thickness variation of at least 500 nanometers, as described above. In some embodiments, this thickness variation is measured over at least about a 50 micrometer length across part 1200.

In some embodiments, the approach of smoothing the exterior surface of the oxide film (FIGS. 10A-11) may be preferred over roughening the exterior surface of the oxide film (FIGS. 12A-12D) if it results in a surface less prone to retaining foreign material such as dirt. The exterior surface of the oxide film may not have as much bearing on the visual appearance of a finished part compared to the topology of the surface of the interface between the oxide film and the substrate. However, the exterior surface of the oxide film may affect the way the part feels to a user. That is, the oxide film may dictate the tactile response of the part. This may be another consideration when deciding on processes for particular applications.

Figure 13:
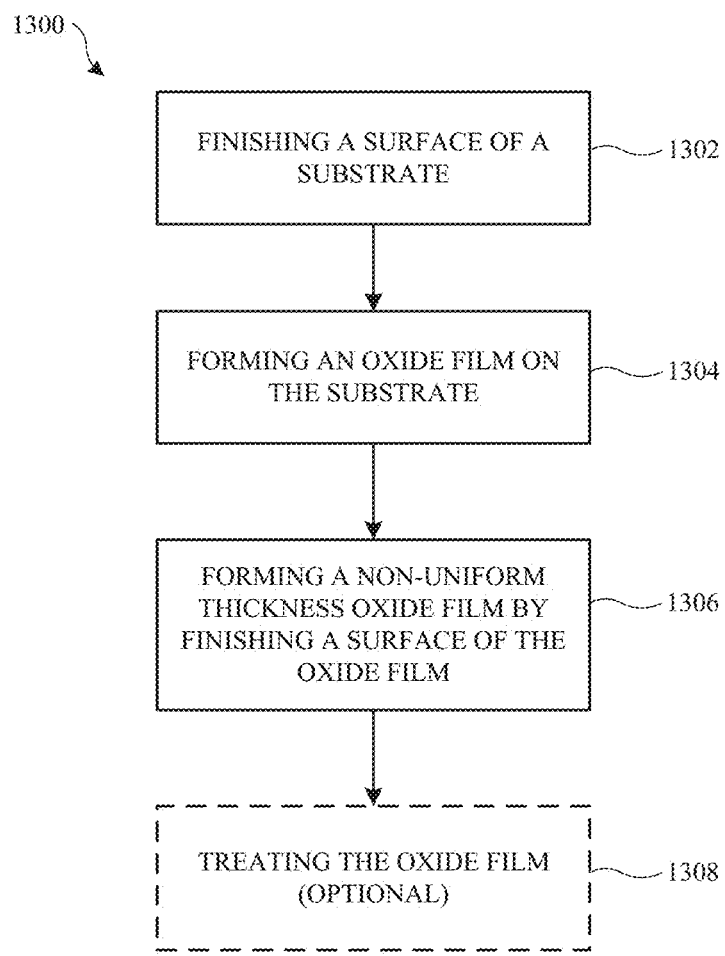
FIG. 13 shows a flowchart indicating a process for forming an oxide film having a non-uniform thickness on a part, in accordance with some embodiments.

FIG. 13 shows flowchart 1300 indicating a process for forming an oxide film having a non-uniform thickness on a part, in accordance with some embodiments. At 1302 a surface of a substrate is finished using one or more finishing processes. In some embodiments, the finishing operation includes texturing a surface of the substrate to a roughness (Ra) of 0.5 micrometer or greater. In other embodiments, the finishing operation includes smoothing a surface of the substrate to a roughness (Ra) of 0.25 micrometer or less.

At 1304, an oxide film is formed on the substrate. In some embodiments, the oxide film is formed using an anodizing process, whereby a portion of the substrate is converted to an anodic film. In some embodiments, the oxide film is formed using a deposition process, such as one or more PVD, sputtering, CVD, and dip coating processes. After the oxide film is formed, the part includes an interface surface defined by oxide film and the substrate. The topography of the interface surface matches the topography of the finished substrate (at step 1302).

At 1306, finishing a surface of the oxide film forms a non-uniform thickness oxide film. In embodiments where the interface surface is rough, the finishing operation includes smoothing operation. In some cases, the oxide film is smoothed to achieve a predetermined roughness value—such as a roughness (Ra) of 0.25 micrometer or less. In embodiments where the interface surface is smooth, the finishing operation includes a roughening operation. In some cases, the oxide film is roughened to achieve a predetermined roughness value—such as a roughness (Ra) of 0.5 micrometer or greater. After the surface finishing operation, in some embodiments the oxide film has a thickness ranging from about 1 micrometer to about 5 micrometers, and thickness variation of at least 500 nanometers across a length of the part.

At 1308, the oxide film is optionally treated to obtain a cosmetic or physical quality. In some embodiments where the oxide film is an anodic film, pores within the anodic film are infused with a colorant to impart a color to the oxide film. The colorant can include any suitable colorant, including one or more suitable dyes, pigments, metals, etc. In some cases, the oxide film is treated to increase its corrosion resistance. For example, if the oxide film is an anodic film, the pores within the anodic film can be sealed using one or more sealing operations. In some embodiments, a hydrothermal sealing operation is used, where the part is exposed to hot aqueous solution until pore walls of the anodic film swell and close off the pores.

Although the above description refers titanium, titanium alloy, aluminum and aluminum alloy substrates, the coatings described herein may be applied to other metals and their alloys. For example, steel (e.g., stainless steel), magnesium, magnesium alloys, zirconium, and zirconium alloys may also benefit the described oxide films.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An enclosure for an electronic device, the enclosure comprising:
   a metal substrate; and
   an oxide film disposed on the metal substrate, the oxide film having a thickness between about 1 micrometer and about 5 micrometers, the thickness varying by at least 2.8 micrometers across the oxide film, an interface between the metal substrate and the oxide film having a greater roughness than an exterior surface of the oxide film.

2. The enclosure of claim 1, wherein the thickness varies across a length of about 50 to about 500 micrometers of the oxide film.

3. The enclosure of claim 1, wherein the exterior surface has a roughness (Ra) of 0.25 micrometer or less.

4. The enclosure of claim 1, wherein the interface has a roughness (Ra) of 0.5 micrometer or greater.

5. The enclosure of claim 1, wherein the metal substrate comprises titanium or a titanium alloy.

6. The enclosure of claim 1, wherein the metal substrate comprises aluminum or an aluminum alloy.

7. The enclosure of claim 1, wherein the oxide film comprises titanium oxide, aluminum oxide, silicon oxide, or zirconium oxide.

8. A method of forming an oxide film on a metal substrate of an enclosure for an electronic device, the method comprising:
   performing a surface finishing operation on the metal substrate;
   forming the oxide film on the metal substrate; and
   performing a surface finishing operation on the oxide film, wherein a thickness of the finished oxide film is between about 1 micrometer and about 5 micrometers, the thickness varying across the finished oxide film by at least 2.8 micrometers, an interface between the metal substrate and the finished oxide film having a greater roughness than an exterior surface of the finished oxide film.

9. The method of claim 8, wherein performing the surface finishing operation on the metal substrate includes texturing a surface of the metal substrate to a roughness (Ra) of 0.5 micrometer or greater.

10. The method of claim 9, wherein performing a surface finishing operation on the oxide film includes smoothing an exterior surface of the oxide film to a roughness (Ra) of 0.25 micrometer or less.

* * * * *